United States Patent
Ueno et al.

(10) Patent No.: US 9,985,127 B2
(45) Date of Patent: May 29, 2018

(54) SEMICONDUCTOR DEVICE INCLUDING A MESA GROOVE AND A RECESS GROOVE

(71) Applicant: TOYODA GOSEI CO., LTD., Kiyosu-shi (JP)

(72) Inventors: Yukihisa Ueno, Kiyosu (JP); Nariaki Tanaka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days. days.

(21) Appl. No.: 15/464,112

(22) Filed: Mar. 20, 2017

(65) Prior Publication Data

US 2017/0288050 A1    Oct. 5, 2017

(30) Foreign Application Priority Data

Mar. 29, 2016 (JP) ................................. 2016-066581

(51) Int. Cl.
*H01L 29/78* (2006.01)
*H01L 29/20* (2006.01)
(Continued)

(52) U.S. Cl.
CPC ...... *H01L 29/7813* (2013.01); *H01L 21/2654* (2013.01); *H01L 29/0619* (2013.01);
(Continued)

(58) Field of Classification Search
CPC ............. H01L 29/7813; H01L 21/2654; H01L 29/0619; H01L 29/0865; H01L 29/0882; H01L 29/1095; H01L 29/2003; H01L 29/402; H01L 29/66734; H01L 29/0615; H01L 29/0661; H01L 29/7811
(Continued)

(56) References Cited

U.S. PATENT DOCUMENTS 8,492,867 B2   7/2013  Yamamoto et al.
2015/0349051 A1*  12/2015  Uchida ............... H01L 29/0619
                                                                257/77
(Continued)

FOREIGN PATENT DOCUMENTS

JP          5691259 B2     4/2015

*Primary Examiner* — Shahed Ahmed
(74) *Attorney, Agent, or Firm* — McGinn IP Law Group, PLLC

(57) ABSTRACT

To improve the breakdown voltage of a semiconductor device. In a terminal region of the semiconductor device, a mesa groove, a recess groove, an electric field relaxation region, and a gradient distributed low concentration p-type layer region are formed. A recess groove is fromed between a device region and the mesa groove so as to surround the device region. A region where a p-type layer is thinned by the recess groove is the electric field relaxation region. The gradient distributed low concentration p-type layer region is formed on the surface of the electric field relaxation region. The average carrier concentration of the entire gradient distributed low concentration p-type layer region is lower than the carrier concentration of the p-type layer. By forming the gradient distributed low concentration p-type layer region, the electric field relaxation region is quickly completely depleted when a reverse voltage is applied, thereby improving the breakdown voltage.

10 Claims, 9 Drawing Sheets

(51) Int. Cl.
  *H01L 29/66* (2006.01)
  *H01L 29/08* (2006.01)
  *H01L 29/10* (2006.01)
  *H01L 21/265* (2006.01)
  *H01L 29/40* (2006.01)
  *H01L 29/06* (2006.01)

(52) U.S. Cl.
  CPC ...... *H01L 29/0865* (2013.01); *H01L 29/0882* (2013.01); *H01L 29/1095* (2013.01); *H01L 29/2003* (2013.01); *H01L 29/402* (2013.01); *H01L 29/66734* (2013.01)

(58) Field of Classification Search
  USPC .......... 257/197, 329, 397, 565; 438/44, 170, 438/259, 270, 361
  See application file for complete search history.

(56) References Cited

U.S. PATENT DOCUMENTS

| | | | |
|---|---|---|---|
| 2016/0181415 A1* | 6/2016 | Masuda | H01L 29/66068 257/77 |
| 2017/0154953 A1* | 6/2017 | Wada | H01L 29/063 |

\* cited by examiner

SEMICONDUCTOR DEVICE INCLUDING A MESA GROOVE AND A RECESS GROOVE

BACKGROUND OF THE INVENTION

Field of the Invention

The present invention relates to a semiconductor device having a terminal structure in the outer periphery of a device region, and a production method therefor.

Background Art

In a vertical semiconductor device establishing electrical continuity in a direction perpendicular to the main surface of a substrate, a pn junction interface is exposed on a terminal part of the device. When a reverse voltage is applied to the semiconductor device, there is a problem that the breakdown voltage does not reach the design value because the electric field is concentrated at the pn interface exposed on the terminal surface. A terminal structure such as field plate structure and guard ring structure is generally formed in the outer periphery of the device region to improve the breakdown voltage.

Japanese Patent No. 5691259 discloses the structure in which recess grooves are formed on the terminal region of the p-type layer formed on the n-type layer, and a region of the thinned p-type layer (electric field relaxation region) is formed. In this structure, a depletion layer is formed at a pn junction between the electric field relaxation region and the n-type layer, and equipotential lines are uniformly distributed on the terminal side in the depletion layer, thereby relaxing the electric field concentration.

However, breakdown voltage is not sufficiently improved even in the structure of Japanese Patent No. 5691259, further improvement in the breakdown voltage was sought.

SUMMARY OF THE INVENTION

In view of the foregoing, an object of the present invention is to achieve a semiconductor device exhibiting improved breakdown voltage, and to provide a method for producing the semiconductor device.

In one aspect of the present invention, there is provided a semiconductor device comprising a device region having a first conductivity type first layer, a second conductivity type second layer formed on the first layer, and an interface between the first layer and the second layer being exposed on the end surfaces of the first layer and the second layer, being positioned in the center of the device, and serving as an operating region of the device, and a terminal region being formed in the periphery of the device region and surrounding the device region, wherein the terminal region comprises a mesa groove surrounding the device region and having a depth reaching from the surface of the second layer to the first layer, a recess groove being formed between the device region and the mesa groove so as to surround the device region and having an electric field relaxation region formed by thinning the second layer, and a second conductivity type third layer being formed in the electric field relaxation region and having a carrier concentration lower than that of the second layer.

In the present invention, when the first conductivity type is n-type, the second conductivity type means p-type, and when the first conductivity type is p-type, the second conductivity type means n-type.

Moreover, in the present invention, the mesa groove and the recess groove are continuously formed in a two-step shape, and the side surface on the device region side of the mesa groove is preferably flush with the side surface on the mesa groove side of the third layer. Thereby, the breakdown voltage of the semiconductor device can be improved.

The side surface on the recess groove side of the third layer is preferably outside the side surface on the device region side of the recess groove. Thereby, the breakdown voltage of the semiconductor device can be further improved.

The third layer may have a carrier concentration distribution in which the carrier concentration is gradually increased from the surface of the electric field relaxation region toward the first layer. The third layer having such a carrier concentration distribution can be easily formed by ion implantation.

The semiconductor device of the present invention may have further a first conductivity type fourth layer formed in the device region of the second layer, and a second conductivity type fifth layer being formed in the second layer on the first layer side of the fourth layer and having a carrier concentration distribution in which the carrier concentration is gradually increased from the fourth layer toward the first layer. In this case, the bottom surface of the third layer may be closer to the first layer than the bottom surface of the fifth layer is to the first layer, thereby further improving the breakdown voltage. The bottom surface of the third layer may reach the interface between the first layer and the second layer. The bottom surface of the third layer is flush with the bottom surface of the fifth layer, and a second layer may exist between the bottom surfaces of the third layer and the fifth layer and the interface between the first layer and the second layer.

The present invention may be applied to any semiconductor device, and may be a field effect transistor in which the first layer is a drift region, the second layer is a body region, and the fourth layer is a source region.

The width of the third layer is preferably 5 μm or more. When the width is 5 μm or more, the breakdown voltage can be sufficiently improved.

The present invention may be applied to a semiconductor device being made of any semiconductor material, and more specifically, it is effective to a semiconductor device being made of Group III nitride semiconductor. Although it has been difficult to improve the breakdown voltage of the Group III nitride semiconductor device, the present invention can significantly improve the breakdown voltage.

In the other aspect of the present invention, there is provided a method for producing a semiconductor device. The method comprises forming a device region including a first conductivity type first layer, a second conductivity type second layer formed on the first layer, and an interface between the first layer and the second layer exposed on the end surfaces of the first layer and the second layer; and forming a terminal region surrounding the device region. The method comprises forming first conductivity type fourth layer in the terminal region and the device region respectively of the second layer by ion implantation into the terminal region and the device region of the second layer respectively. The method comprises forming a third layer and a fifth layer in the second layer of the terminal region and the device region respectively by the ion implantation to form the fourth layer such that the third layer and the fifth layer have a carrier concentration distribution in which the carrier concentration is gradually increased toward the first layer. The method comprises forming a mesa groove surrounding the device region and having a depth reaching from the surface of the second layer to the first layer, thereby the fourth layer disposed above the third layer being removed. And the method comprises forming a recess groove surrounding the device region between the device region and the mesa groove and having an electric field relaxation region of the thinned second layer, thereby the fourth layer disposed above the third layer being removed.

According to the production method of the present invention, the third layer of the electric field relaxation region and the fourth layer of the device region can be simultaneously formed, thereby easily forming the third layer.

In the present invention, the third layer has a low carrier concentration and a small thickness. Therefore, when a reverse voltage is applied, the third layer is depleted earlier than the second layer. The depleted region serves as a region for relaxing the electric field concentration at the pn interface exposed at the end surfaces of the semiconductor device, thereby remarkably improving the breakdown voltage.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiments.
Embodiment 1

Figure 1:
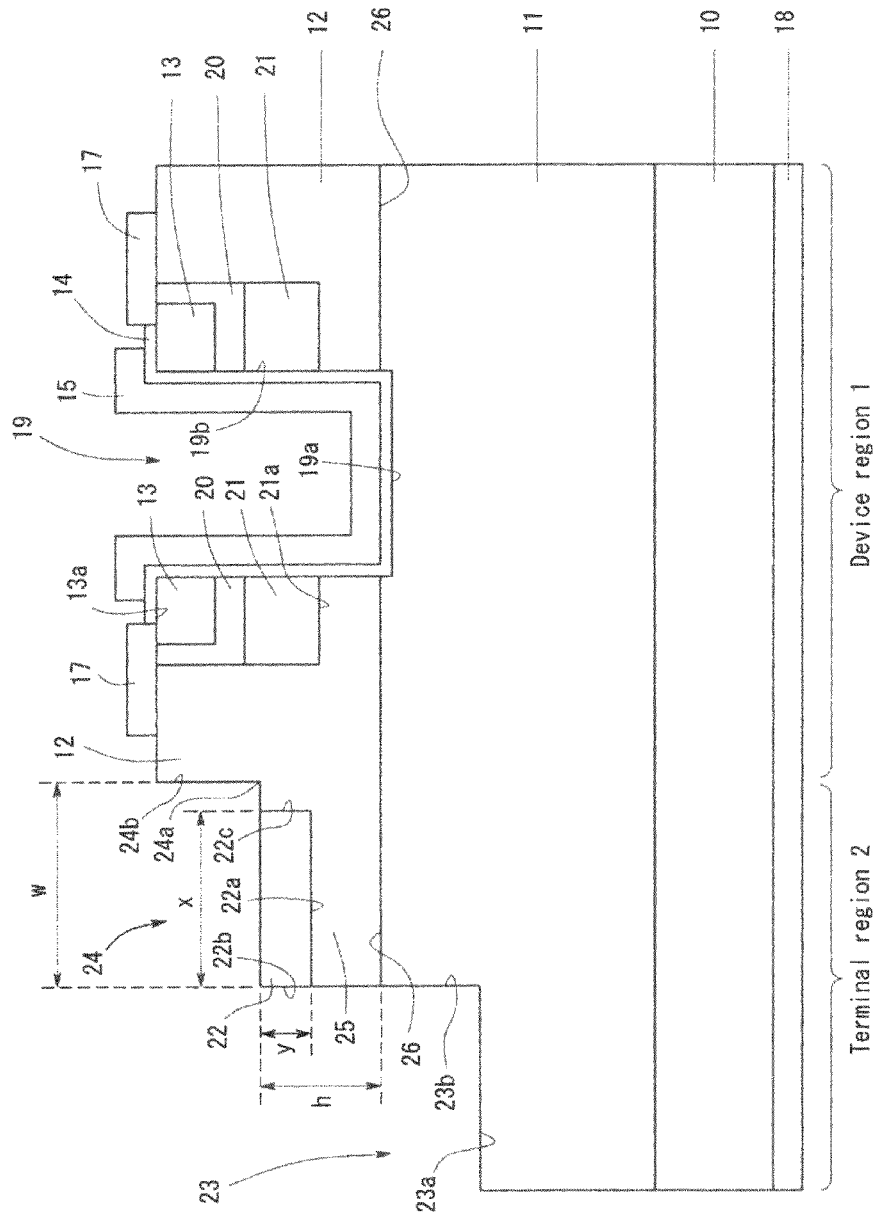
FIG. 1 is a sketch showing the structure of a semiconductor device according to Embodiment 1.

FIG. 1 is a sketch showing the structure of a semiconductor device according to Embodiment 1. The semiconductor device according to Embodiment 1 is a trench-type vertical MOSFET, and comprises a substrate 10, a first n-type layer 11 (drift region) deposited on the substrate 10, a p-type layer 12 (body region) deposited on the first n-type layer 11, and a second n-type layer 13 (source region) formed on a part of the p-type layer 12 as shown in FIG. 1.

The semiconductor device further comprises a gate insulating film 14, a gate electrode 15, a source electrode 17, a drain electrode 18, and a trench 19. The semiconductor device according to Embodiment 1 comprises a device region 1 being disposed at the center of the device and functioning and operating as MOSFET, and a terminal region 2 being formed in the outer periphery of the device region 1 so as to surround the device region 1. The terminal region 2 is a region having a structure to improve the breakdown voltage of the semiconductor device according to Embodiment 1. In the terminal region 2, a mesa groove 23, a recess groove 24, an electric field relaxation region 25, and a gradient distributed low concentration p-type layer region 22 are provided.

As a whole the semiconductor device according to Embodiment 1 consists of a structure in which the unit cells of regular hexagon shape operating as a vertical MOSFET are arranged in a honeycomb pattern and connected in parallel, and a terminal region 2 surrounding the whole structure (device region 1). More specifically, the planar pattern of the trench 19 corresponds to the side of the regular hexagon in the above honeycomb pattern, and the source electrode 17 is disposed at the center of the regular hexagon. Needless to say, the pattern of each unit cell and the arrangement pattern of the unit cells are not limited to the above pattern, and any pattern may be used. However, the above honeycomb pattern is advantageous in terms of increasing the efficiency of plane filling or reducing the ON resistance. FIG. 1 shows a cross section of the structure of one unit cell of the semiconductor device and its adjacent terminal region 2.

The structure of the semiconductor device will next be described in detail.

The substrate 10 is a flat substrate made of Si-doped c-plane n-GaN having a thickness of 300 μm. The Si concentration of the substrate 10 is $1 \times 10^{18}/cm^3$. The substrate 10 may be made of any conductive material which can be used as a substrate for growing Group III nitride semiconductor, other than n-GaN. For example, ZnO and Si may be used. However, in terms of lattice matching, a GaN substrate is preferably used as in the present embodiment.

The first n-type layer 11 is a Si-doped n-type GaN layer being deposited on the substrate 10 and having a thickness of 10 μm. The Si concentration of the first n-type layer 11 is $8 \times 10^{15}/cm^3$. The first n-type layer 11 corresponds to the first conductivity type first layer of the present invention.

The p-type layer 12 is a Mg-doped p-type GaN layer being deposited on the n-type layer 11 and having a thickness of 1 μm. The Mg concentration of the p-type layer 12 is $2 \times 10^{17}/cm^3$. The p-type layer 12 corresponds to second layer of the present invention.

The second n-type layer 13 is an n-type carrier injection region formed by implanting Si ions as an n-type dopant into the p-type layer 12, and has a thickness of 0.2 μm. A low concentration p-type layer region 20 where the carrier concentration of the p-type layer 12 was decreased by the diffusion of Si, is spread in the periphery of the second n-type layer 13.

On the first n-type layer side of the low concentration p-type layer region 20, a gradient distributed low concentration p-type layer region 21 is extended up to a depth which does not reach the first n-type layer 11. The gradient distributed low concentration p-type layer region 21 has a distribution in which Si as an n-type dopant further diffuses from the low concentration p-type layer region 20 toward the first n-type layer 11, and the Si concentration is reduced toward the first n-type layer 11. Therefore, the closer to the low concentration p-type layer region 20, the lower the hole concentration. As a result, the gradient distributed low concentration p-type layer region 21 has a distribution in which the carrier (hole) concentration is gradually increased from the low concentration p-type layer region 20 toward the first n-type layer 11. The carrier concentration of the gradient distributed low concentration p-type region 21 is equal to or higher than the carrier concentration of the low concentration p-type layer region 20 in the region in contact with the low concentration p-type layer region 20, and equal to or lower than the carrier concentration of the p-type layer 12 in the region in contact with the p-type layer 12. The average carrier (hole) concentration of the gradient distributed low concentration p-type region 21 is $1 \times 10^{16}/cm^3$.

The trench 19 is a trench formed at a predetermined position so as to have a depth passing through the second n-type layer 13, p-type layer 12 and reaching the first n-type layer 11. The first n-type layer 11 is exposed on the bottom surface 19a of the trench 19, and the first n-type layer 11, the p-type layer 12, and the second n-type layer 13 are exposed on the side surfaces 19b of the trench 19.

The trench 19 may have any shape. However, the side surface 19b of the trench 19 is preferably a m-plane of GaN. When the trench 19 is formed by dry etching, damage to GaN is reduced, thereby reducing the gate leakage. The side surfaces 19b of the trench 19 may not necessarily be perpendicular to the main surface of the substrate 10, and may be inclined.

The gate insulating film 14 is continuously formed in a film on the bottom surface 19a of the trench 19, the side surfaces 19b of the trench 19, and the top surfaces 13a near the side surfaces 19b of the trench 19 of the second n-type layers 13. The gate insulating film 14 is made of $SiO_2$.

In Embodiment 1, the gate insulating film 14 is made of $SiO_2$, but may be made of other insulating material. For example, $ZrO_2$, $HfO_2$, SiN, ZrON, SiON, $Al_2O_3$, and AlON may be used.

The gate insulating film 14 may be a multilayer film. For example, when the gate insulating film 14 is a multilayer film, the layer in contact with the semiconductor layer may be made of $SiO_2$, and other layers may be made of a material having a relative dielectric constant higher than that of $SiO_2$. Thus, while reducing damage to the semiconductor layer in film formation, the effective relative dielectric constant of the gate insulating film 14 can be increased. More specifically, $SiO_2$/ZrON and $SiO_2$/$Al_2O_3$ may be used. Here, the symbol "/" refers to a layered structure, and "A/B" refers to a layered structure in which layer B is formed after formation of layer A. The same shall apply hereinafter in describing.

The gate electrode 15 is continuously formed in a film on the bottom surface 19a of the trench 19, the side surfaces 19b of the trench 19, the top surfaces 13a near the side surfaces 19b of the trench of the second n-type layer 13 via the gate insulating film 14. The gate electrode 15 is made of Al.

The source electrode 17 is continuously formed on a part of the region on the p-type layer 12 and the second n-type layer 13. The source electrode 17 is made of a conductive material having an ohmic contact with the second n-type layer 13, that is, Ti/Al. Ti/Al/Ni/Au, TiN/Al, and Pd/Ti/Al may also be used.

A part except for the contact holes for the gate electrode 15 and the source electrode 17 is covered with a passivation film (not illustrated). The passivation film may be made of the same material as the material of the gate insulating film 14. The passivation film may be made of a material different from the material of the gate insulating film 14, for example, $Al_2O_3$, ZrON, and SiON.

The drain electrode 18 is formed in contact with the rear surface of the substrate 10 (the surface opposite to the surface on which the first n-type layer 11 is formed). The material of the drain electrode 18 is a conductive material having an ohmic contact with the substrate 10, and the same material as that of the source electrode 17. Needless to say, as long as the material has an ohmic contact with the substrate 10, different materials may be used for the source electrode 17 and the drain electrode 18.

Next will be described the structure of the terminal region 2 surrounding the device region 1.

In the terminal region 2 of the semiconductor device according to Embodiment 1, a mesa groove 23 is formed so as to surround the device region 1. The mesa groove 23 has a depth passing through the p-type layer 12 from the surface of the p-type layer 12 and reaching the first n-type layer 11. Due to the mesa groove 23, the cross section of the semiconductor device according to Embodiment 1 has a mesa shape (terrace shape). The side surface 23b of the mesa groove 23 may be perpendicular or inclined to the main surface of the substrate 10. The mesa groove 23 is stepped, and has a structure having only the side surface 23b on the device region 1 side. However, the mesa groove 23 may have the side surface on the side opposite to the device region 1. That is, the mesa groove 23 may have side surfaces on the both sides of the mesa groove 23. A plurality of mesa grooves 23 may be concentrically formed.

A recess groove 24 is formed between the device region 1 and the mesa groove 23 so as to surround the device region 1. The mesa groove 23 is overlapped with and continued to the recess groove 24. The recess groove 24 does not have the side surface on the mesa groove 23 side. The terminal region 2 has a two-stepped structure of the bottom surface 23a of the mesa groove 23, the side surface 23b of the mesa groove 23, the bottom surface of the recess groove 24 (the top surface of the electric field relaxation region 25 described later), the side surface 24b of the recess groove 24, and the top surface of the p-type layer 12 arranged in this order. The recess groove 24 has a depth not reaching the first n-type layer 11 from the surface of the p-type layer 12, and a region of the p-type layer 12 thinned by the recess groove 24 is formed. The region thinned by the recess groove 24 of the p-type layer 12 is referred to as an electric field relaxation region 25. On the bottom surface of the recess groove 24, the gradient distributed low concentration p-type layer region 22 and a part of the p-type layer 12 are exposed. The side surface 23b of the mesa groove 23 or the side surface of the recess groove 24 does not need to be perpendicular to the main surface of the substrate 10, and may be inclined to the main surface of the substrate 10. The breakdown voltage of the semiconductor device can be improved by inclining the side surface of the mesa groove 23 or the side surface of the recess groove 24. The inclination angle is preferably 45° to 80° relative to the main surface of the substrate 10.

The electric field relaxation region 25 is fromed by the recess groove 24 to relax concentration of electric field in a pn interface 26 exposed on the side surface of the mesa groove 23, thereby improving the breakdown voltage. This is because the depletion layer is formed at the pn junction between the p-type electric field relaxation region 25 and the first n-type layer 11, and equipotential lines are evenly spaced on the terminal region side in the depletion layer.

The width W of the electric field relaxation region 25 is preferably 5 μm to 50 μm. The width is made to be within this range, thereby further improving the breakdown voltage of the semiconductor device according to Embodiment 1. When the width W is smaller than 5 µm, equipotential lines are not sufficiently spaced in a horizontal direction so that the breakdown voltage is not sufficiently improved. Also, it is not desirable because the width x of the gradient distributed low concentration p-type layer region 22 cannot be sufficiently secured. When the width W is larger than 50 µm, the effect of improving the breakdown voltage is saturated, which is not desirable. The width W is more preferably, 5 µm to 30 µm, and further preferably, 10 µm to 30 µm.

The thickness h of the electric field relaxation region 25 is preferably 50 nm to 1,000 nm. The thickness is made to be within this range, thereby improving the breakdown voltage of the semiconductor device according to Embodiment 1. When the thickness h is less than 50 nm, the thickness h of the electric field relaxation region 25 is too thin, and the thickness y of the gradient distributed low concentration p-type layer region 22 described later cannot be sufficiently secured. As a result, the breakdown voltage is not sufficiently improved. When the thickness h is more than 1,000 nm, the electric field relaxation region 25 is not completely depleted when applying a reverse voltage. As a result, the breakdown voltage is not sufficiently improved. The thickness h of the electric field relaxation region 25 is more preferably, 50 nm to 500 nm, and further preferably, 100 nm to 500 nm.

In Embodiment 1, the mesa groove 23 is continued to the recess groove 24 to have a stepped shape. However, the mesa groove 23 may not be continued to the recess groove 24, but the mesa groove 23 is preferably continued to the recess groove 24. When the mesa groove 23 is not continued to the recess groove 24, there is the p-type layer 12 which is not made to be thin between the mesa groove 23 and the recess groove 24, and the breakdown voltage cannot be sufficiently improved.

The gradient distributed low concentration p-type layer region 22 is formed as a surface layer of the electric field relaxation region 25. The gradient distributed low concentration p-type layer region 22 corresponds to the third layer of the present invention. The gradient distributed low concentration p-type layer region 22 is a region formed at the same time when the gradient distributed low concentration p-type region 21 is formed. Therefore, the bottom surface 22a of the gradient distributed low concentration p-type layer region 22 is in flush with the bottom surface 21a of the gradient distributed low concentration p-type region 21. The bottom surface 22a does not reach the pn interface 26, and the p-type layer 12 exists between the bottom surface 22a and the pn interface 26. The carrier concentration distribution is the same as that of the gradient distributed low concentration p-type region 21. That is, the hole concentration is reduced as closer to the surface of the electric field relaxation region 25 by the diffusion of Si as an n-type dopant. As a result, the gradient distributed low concentration p-type layer region 22 is a region having a distribution in which the carrier concentration is gradually increased form the surface of the electric field relaxation region 25 toward the first n-type layer 11. The carrier (hole) concentration of the gradient distributed low concentration p-type layer region 22 is equal to or more than the carrier concentration of the low concentration p-type layer region 20 on the surface of the electric field relaxation region 25 (that is, the region where the carrier concentration of the gradient distributed low concentration p-type layer region 22 is lowest). The carrier concentration of the gradient distributed low concentration p-type layer region 22 is equal to or less than the carrier concentration of the p-type layer 12 on the bottom surface 22a of the gradient distributed low concentration p-type layer region 22 in contact with the p-type layer 12 (that is, the region where the carrier concentration of the gradient distributed low concentration p-type layer region 22 is highest). The average carrier (hole) concentration of the entire gradient distributed low concentration p-type layer region 22 is $1 \times 10^{16}/cm^3$, lower than the carrier concentration of the p-type layer 12.

The breakdown voltage of the semiconductor device can be further improved by forming the gradient distributed low concentration p-type layer region 22 having the above structure on the electric field relaxation region 25. The reason is as follows.

When a reverse voltage is applied to the semiconductor device according to Embodiment 1, a depletion layer extends from the pn interface 26. The low concentration p-type layer region 20 or the second n-type layer 13 is not disposed above the gradient distributed low concentration p-type layer region 22, and the electrode such as the source electrode 17 is not in contact with the gradient distributed low concentration p-type layer region 22. Moreover, the carrier concentration of the gradient distributed low concentration p-type layer region 22 is set lower than the carrier concentration of the p-type layer 12 as described above, and the thickness of the electric field relaxation region 25 is also set small. Therefore, the entire electric field relaxation region 25 is completely depleted earlier than other region of the p-type layer 12. In other words, the electric field relaxation region 25 is completely depleted at a reverse voltage lower than other region of the p-type layer 12. In the completely depleted region, the potential gradually changes, and the electric field concentration is relaxed at the pn interface 26 exposed on the side surface of the mesa groove 23. As a result, the breakdown voltage of the semiconductor device according to Embodiment 1 is remarkably improved.

A new electric field concentration occurs at the corner 24a of the recess groove 24 by forming the gradient distributed low concentration p-type layer region 22. This may cause avalanche breakdown. However, the corner of the recess groove 24 is closer to the source electrode 17 than the pn interface 26 exposed on the side surface of the mesa groove 23 is to the source electrode 17, and the hole generated at the corner can be efficiently extracted from the source electrode 17. Thus, a critical breakdown is suppressed.

Figure 7:
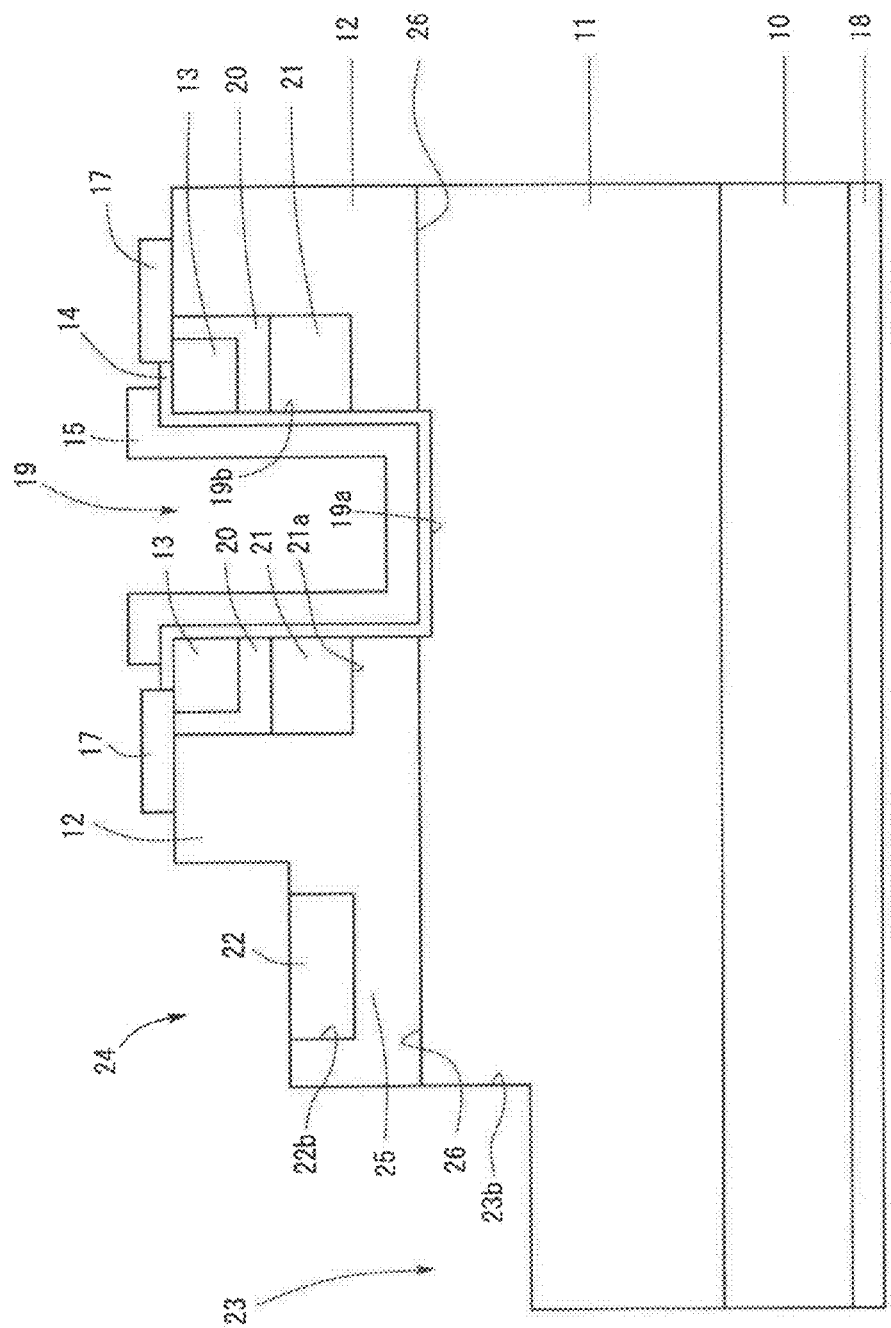
FIG. 7 is a sketch showing the structure of a semiconductor device according to a variation of Embodiment.

The side surface 22b on the mesa groove 23 side of the gradient distributed low concentration p-type layer region 22 coincides with and is in flush with the side surface 23b of the mesa groove 23. That is, the p-type layer 12 does not exist between the side surface 22b on the mesa groove 23 of the gradient distributed low concentration p-type layer region 22 and the side surface 23b of the mesa groove 23. Thus, the breakdown voltage of the semiconductor device according to Embodiment 1 is further improved. Needless to say, as long as the desired breakdown voltage is sufficient, the side surface 22b of the gradient distributed low concentration p-type layer region 22 may be setbacked to on the device region 1 side from the side surface 23b of the mesa groove 23 (refer to FIG. 7).

The side surface 22c on the device region 1 side of the gradient distributed low concentration p-type layer region 22 is nearer to the side surface 23b of the mesa groove 23 than the side surface 24b of the recess groove 24 is, and the width x of the gradient distributed low concentration p-type layer region 22 is smaller than the width W of the electric field relaxation region 25. In this way, the breakdown voltage of the semiconductor device according to Embodiment 1 is further improved by providing the p-type layer 12 between the side surface 22c of the gradient distributed low concentration p-type layer region 22 and the side surface 24b of the recess groove 24. Needless to say, as long as the desired breakdown voltage is sufficient, the side surface 22c of the gradient distributed low concentration p-type layer region 22 may be in flush with the side surface 24b of the recess groove 24. Alternatively, the side surface 22c of the gradient distributed low concentration p-type layer region 22 may be positioned to be nearer to the trench 19 than the side surface 24b of the recess groove 24 is.

The gradient distributed low concentration p-type layer region 22 have any carrier concentration as long as the average carrier concentration of the entire gradient distributed low concentration p-type layer region 22 is lower than the carrier concentration of the p-type layer 12. Here, the carrier concentration of the p-type layer 12 means the average carrier concentration of the entire p-type layer 12 when the p-type layer 12 comprises a plurality of layers or when the carrier concentration has a distribution. However, the minimum value is preferably equal to or higher than the carrier concentration of the low concentration p-type layer region 20, and the maximum value is preferably equal to or lower than the carrier concentration of the p-type layer 12. The lower limit for the average carrier concentration of the entire gradient distributed low concentration p-type layer region 22 may be within a range where the gradient distributed low concentration p-type layer region 22 is p-type without being turned into n-type or intrinsic. However, the average carrier concentration of the entire gradient distributed low concentration p-type layer region 22 is preferably $1 \times 10^{15}/cm^3$ or higher in the actual manufacturing process.

The thickness y of the gradient distributed low concentration p-type layer region 22 is preferably 50 nm or more. When the thickness y is smaller than 50 nm, the electric field relaxation region 25 is not quickly and completely depleted, and the breakdown voltage cannot be sufficiently improved. The thickness y is more preferably, 100 nm or more, and further preferably, 200 nm or more.

The thickness y of the gradient distributed low concentration p-type layer region 22 may be same as the thickness h of the electric field relaxation region 25. That is, the bottom surface 22a of the gradient distributed low concentration p-type layer region 22 may reach the pn interface 26. However, in Embodiment 1, the gradient distributed low concentration p-type layer region 22 is formed at the same time when the second n-type layer 13 is formed. The gradient distributed low concentration p-type layer region 21 is also formed at the same time, and the bottom surface of the gradient distributed low concentration p-type region 21 also reaches the pn interface 26. Therefore, the breakdown voltage of the device region 1 is reduced. When the bottom surfaces 21a and 22a of the gradient distributed low concentration p-type regions 21 and 22 are on the same level as in Embodiment 1, preferably the bottom surface 22a of the gradient distributed low concentration p-type layer region 22 does not reach the pn interface 26, and the p-type layer 12 exists between the bottom surface 22a and the pn interface 26.

The width x of the gradient distributed low concentration p-type layer region 22 is preferably 5 μm or more. This sufficiently develops the breakdown voltage improvement effect by forming the gradient distributed low concentration p-type layer region 22.

The top surface of the gradient distributed low concentration p-type layer region 22 is flush with the top surface of the electric field relaxation region 25. However, the top surface of the gradient distributed low concentration p-type layer region 22 may be positioned to be nearer to the pn interface 26 than the top surface of the electric field relaxation region 25 is so that the p-type layer 12 exists between the top surface of the gradient distributed low concentration p-type layer region 22 and the top surface of the electric field relaxation region 25. However, the top surfaces are preferably on the same level in terms of breakdown voltage improvement or easy manufacturing of the gradient distributed low concentration p-type layer region 22.

The method for producing the semiconductor device according to Embodiment 1 will be described with reference to FIGS. 2A to 2E.

Figure 2A:
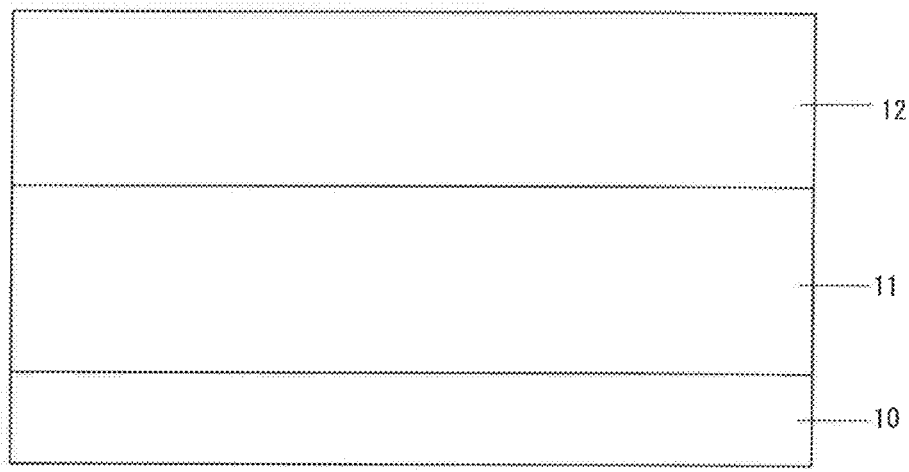
FIG. 2A is a sketch showing processes for producing the semiconductor device according to Embodiment 1.
Figure 2B:
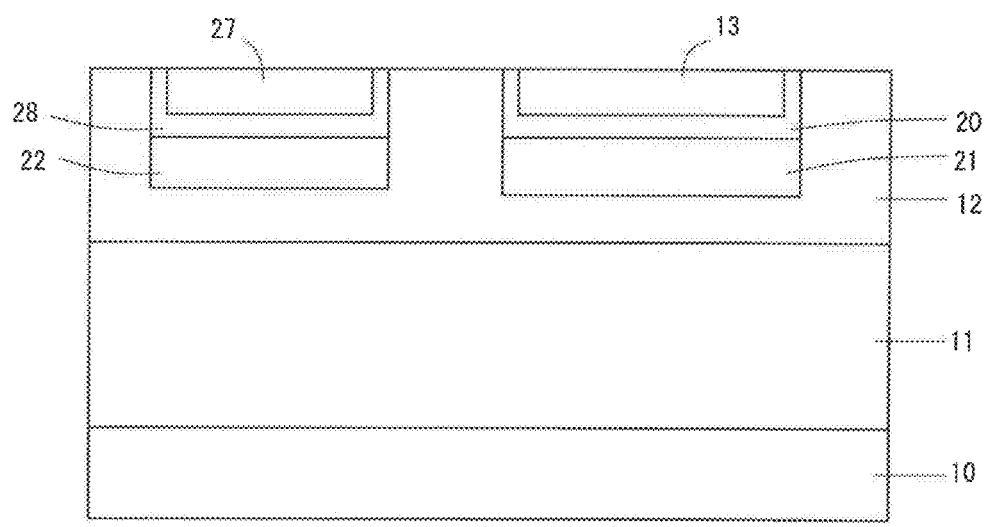
FIG. 2B is a sketch showing processes for producing the semiconductor device according to Embodiment 1.

Firstly, a first n-type layer 11 and a p-type layer 12 are sequentially deposited on the substrate 10 through MOCVD, (refer to FIG. 2A). In MOCVD, Ammonia gas ($NH_3$) is used as a nitrogen source. Trimethylgallium ($Ga(CH_3)_3$: TMG) is used as a Ga source. Trimethylindium ($In(CH_3)_3$: TMI) is used as an In source. Trimethylaluminum ($Al(CH_3)_3$: TMA) is used as an Al source. Silane ($SiH_4$) is used as an n-type dopant gas. Bis(cyclopentadienyl)magnesium ($Mg(C_5H_5)_2$: $CP_2Mg$) is used as a p-type dopant gas. The carrier gas used is hydrogen ($H_2$), nitrogen ($N_2$), or a gas mixture of hydrogen and nitrogen ($H_2+N_2$). After that, the p-type layer 12 is heated to a temperature of 700° C. to 900° C. under nitrogen atmosphere to have a p-type conductivity.

Subsequently, Si is ion-implanted two regions respectively of the surface of the p-type layer 12: a region where a second n-type layer 13 is formed and a region where a gradient distributed low concentration p-type layer region 22 is formed. Heat treatment is performed at a temperature of 900° C. to 1,200° C. under nitrogen atmosphere to activate the implanted Si. Thus, while the second n-type layer 13 is formed, a low concentration p-type layer region 20 and a gradient distributed low concentration p-type region 21 are formed by the diffusion of Si ions from the region where the second n-type layer 13 is formed. Moreover, while a second n-type layer 27 is formed in a region separate from the region where the second n-type layer 13 is formed, a low concentration p-type region 28 and the gradient distributed low concentration p-type layer region 22 are formed by the diffusion of Si ions from the region where the second n-type layer 27 is formed (refer to FIG. 2B). Since the gradient distributed low concentration p-type layer region 22 of the electric field relaxation region can be formed at the same time when the second n-type layer 13 is formed in the method for producing the semiconductor device according to Embodiment 1, the production process can be simplified, thereby reducing the production cost.

Figure 2C:
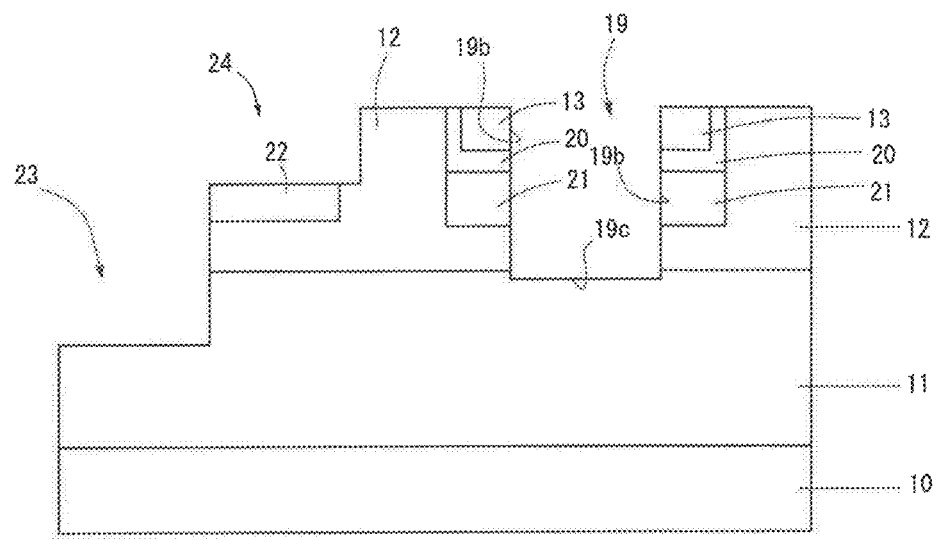
FIG. 2C is a sketch showing processes for producing the semiconductor device according to Embodiment 1.

Next, dry etching is performed at a predetermined position of the surfaces of the second n-type layers 13 and 27 or the surface of the p-type layer 12 to form a trench 19, a mesa groove 23, and a recess groove 24 (refer to FIG. 2C).

The trench 19 is formed so as to have a depth passing through the second n-type layer 13, the low concentration p-type layer region 20, the gradient distributed low concentration p-type region 21, and the p-type layer 12, and exposing the first n-type layer 11. The trench 19 is formed so that the width of the trench 19 is smaller than the width of the second n-type layer 13, and the center of the width of the second n-type layer 13 coincides with the center of the width of the trench 19. Thus, the second n-type layer 13 is exposed on each of two side surfaces 19b of the trench 19.

The mesa groove 23 is formed until it passes through the p-type layer 12 and the first n-type layer 11 is exposed. The recess groove 24 is formed until it passes the second n-type layer 27 and the low concentration p-type layer region 28, and the gradient distributed low concentration p-type layer region 22 is exposed. In forming the mesa groove 23 and the recess groove 24, the second n-type layer 27 and the low concentration p-type layer region 28 above the gradient distributed low concentration p-type layer region 22 are entirely removed. By forming the recess groove 24, while an electric field relaxation region 25 is formed, which is a region of the p-type layer 12 thinned by forming the recess groove 24, the gradient distributed low concentration p-type layer region 22 is disposed in the electric field relaxation region 25.

The trench 19, the mesa groove 23, and the recess groove 24 may be formed in any order. However, the recess groove 24 is preferably formed after the formation of the trench 19 or the mesa groove 23 to accurately control the depth of the recess groove 24. A damage layer is fromed by dry etching on the side surfaces of the trench 19, the mesa groove 23, and the recess groove 24. Therefore, the damaged layer may be removed by wet etching, thereby reducing the current leakage via its side surface. In this case, TMAH (Tetramethylammonium Hydroxide) and others may be used as a wet etching solution.

The breakdown voltage of the semiconductor device according to Embodiment 1 depends not only the depth of the recess groove 24 (the thickness of the electric field relaxation region 25) but the thickness of the gradient distributed low concentration p-type layer region 22. Therefore, the recess groove 24 may be varied in depth accuracy. Thus, the breakdown voltage can be improved with a high yield in semiconductor device according to Embodiment 1.

After the formation of the trench 19, the mesa groove 23, or the recess groove 24, the second n-type layer 13, the low concentration p-type layer region 20, the gradient distributed low concentration p-type layer regions 21 and 22 may be formed by implanting Si ions. In this case, only the gradient distributed low concentration p-type layer region 22 can be formed without forming the second n-type layer 13 on the gradient distributed low concentration p-type layer region 22 by forming a $SiO_2$ film on a predetermined region and adjusting the ion implantation depth or amount according to the film thickness. That is, the Si concentration of the gradient distributed low concentration p-type layer region 22 is lower than the Si concentration of the second n-type layer 13 because Si ions are implanted into the gradient distributed low concentration p-type layer region 22 through the $SiO_2$ film.

When forming the recess groove 24, the low concentration p-type layer region 28 may remain on the gradient distributed low concentration p-type layer region 22. However, the low concentration p-type layer region 28 has a high Si concentration, and may partially have an n-type conductivity. The existence of such region separately causes electric field concentration. Therefore, the low concentration p-type layer region 20 is preferably completely removed on the gradient distributed low concentration p-type layer region 22.

Figure 2D:
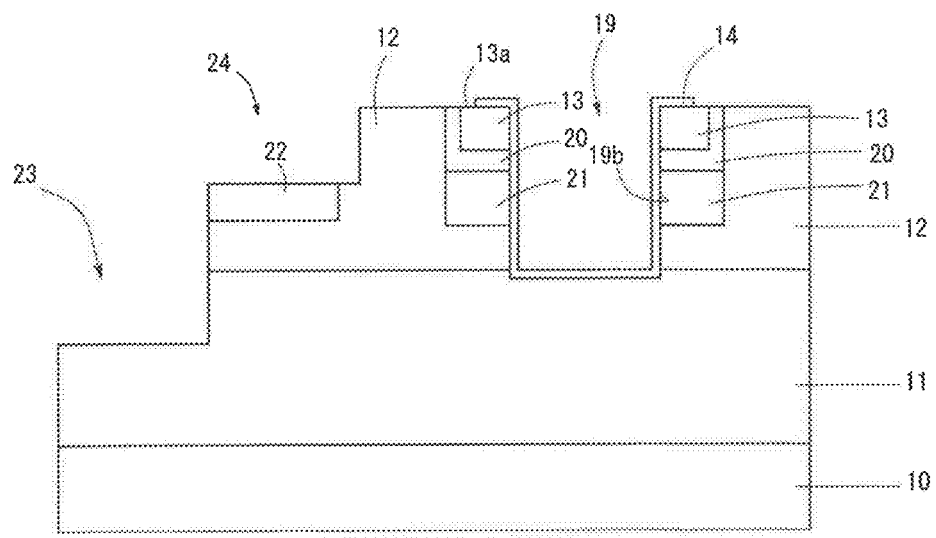
FIG. 2D is a sketch showing processes for producing the semiconductor device according to Embodiment 1.
Figure 2E:
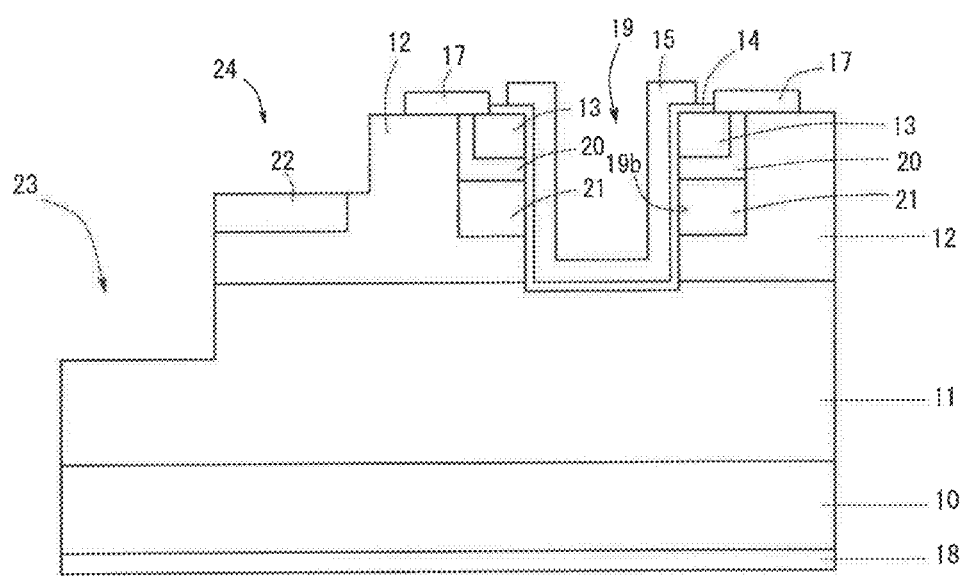
FIG. 2E is a sketch showing processes for producing the semiconductor device according to Embodiment 1.

By film formation through the ALD (Atomic Layer Deposition) method and patterning through etching, a gate insulating film 14 comprising the bottom surface 19a of the trench 19, the side surfaces 19b of the trench 19, and the top surfaces 13a of the second n-type layer 13, is continuously formed in a film in the vicinity of the trench 19 (refer to FIG. 2D). In the ALD method, ozone or oxygen plasma is preferably used as an oxygen source. Thereby, the gate insulating film 14 can be grown at a lower temperature and the film thickness uniformity or film quality can also be improved. The gate insulating film 14 may be formed by the CVD method or sputtering method instead of the ALD method.

Subsequently, a source electrode 17 is formed through the lift-off method over the p-type layer 12 and the second n-type layer 13. Moreover, a drain electrode 18 is formed through the lift-off method on the rear surface of the substrate 10. A gate electrode 15 is formed by vapor deposition and dry etching on the gate insulating film 14 (refer for FIG. 2E). The formation order of the source electrode 17, the drain electrode 18, and the gate electrode 15 is not limited to the above. Any order may be selected. For example, the source electrode 17 and the drain electrode 18 may be sequentially formed after the formation of the gate electrode 15.

Next, an $Al_2O_3$ passivation film (not illustrated) is formed through the ALD method on the entire top surface. A protective film (not illustrated) is formed so as to cover the passivation film. Of the passivation film and the protective film, regions corresponding to the top surfaces of the source electrode 17 and the gate electrode 15 are dry etched to form a contact hole. A wiring electrode (not illustrated) is formed to connect the source electrode 17 and the gate electrode 15. Through the above steps, the semiconductor device according to Embodiment 1 is produced.

Next will be described the results of the experiments regarding the semiconductor device according to Embodiment 1.

Figure 3:
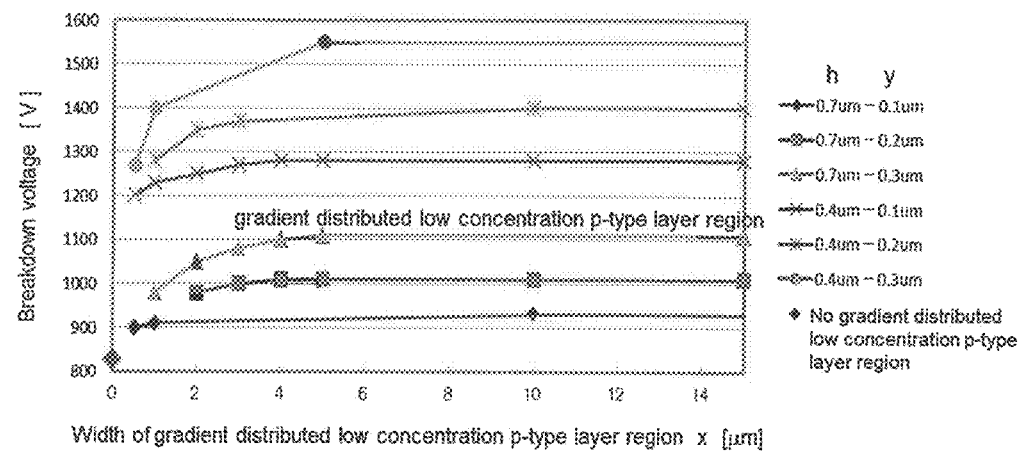
FIG. 3 is a graph showing the relationship between the width of gradient distributed low concentration p-type layer region 22 and the breakdown voltage.

FIG. 3 is a graph showing the results calculated by simulating the relationship between the width x of the gradient distributed low concentration p-type layer region 22 and the breakdown voltage. In the graph of FIG. 3, the horizontal axis indicates width x (μm) of the gradient distributed low concentration p-type layer region 22, and the vertical axis indicates the breakdown voltage (V) of the semiconductor device. The width W of the electric field relaxation region 25 is 30 μm. When the thickness h of the electric field relaxation region 25 is 0.7 μm, the thickness y of the gradient distributed low concentration p-type layer region 22 is 0.1 μm, 0.2 μm, and 0.3 μm (three patterns). When the thickness h of the electric field relaxation region 25 is 0.4 μm, the thickness y of the gradient distributed low concentration p-type layer region 22 is 0.1 μm, 0.2 μm, and 0.3 μm (three patterns). For six patterns in total, the relationship between the width x of the gradient distributed low concentration p-type layer region 22 and the breakdown voltage is shown in a graph. For comparison, the breakdown voltage when the thickness h of the electric field relaxation region 25 is 0.7 μm and the thickness y of the gradient distributed low concentration p-type layer region 22 is 0 μm, that is, the gradient distributed low concentration p-type layer region 22 is not formed, is shown in a graph.

As shown in FIG. 3, when the gradient distributed low concentration p-type layer region 22 is not formed, the breakdown voltage is almost 820 V. This reveals that the breakdown voltage of 900 V or more is obtained by forming the gradient distributed low concentration p-type layer region 22. The larger the width x of the gradient distributed low concentration p-type layer region 22, the higher the breakdown voltage. However, the effect of improving the breakdown voltage is gradually saturated, and almost saturated when the width x is equal to or greater than a certain value. Even if the thickness y of the gradient distributed low concentration p-type layer region 22 and the thickness h of the electric field relaxation region 25 are any value, the effect of improving the breakdown voltage is saturated and the breakdown voltage is a certain value when the width x of the gradient distributed low concentration p-type layer region 22 is 5 μm or more.

It is found from FIG. 3 that the smaller the thickness h of the electric field relaxation region 25, the greater the effect of improving the breakdown voltage, and that the larger the thickness of the gradient distributed low concentration p-type layer region 22, the larger the effect of improving the breakdown voltage. The smaller the thickness h of the electric field relaxation region 25, the easier the electric field relaxation region 25 is completely depleted in the thickness direction. The larger the thickness of the gradient distributed low concentration p-type layer region 22, the higher the ratio of the thickness y of a region where the carrier concentration is low to the thickness h of the electric field relaxation region 2, and the easier the electric field relaxation region 25 is completely depleted.

Figure 4:
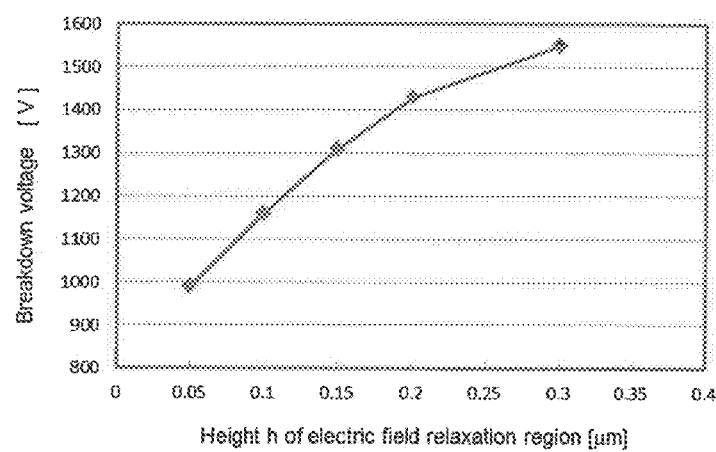
FIG. 4 is a graph showing the relationship between the thickness of electric field relaxation region 25 and the breakdown voltage.

FIG. 4 is a graph showing the results calculated by simulating the relationship between the thickness h of the electric field relaxation region 25 and the breakdown voltage. The thickness y of the gradient distributed low concentration p-type layer region 22 is equal to the thickness h of the electric field relaxation region 25, and the electric field relaxation region 25 is in contact with the first n-type layer 11. The width W of the electric field relaxation region 25 is 30 μm, and the width x of the gradient distributed low concentration p-type layer region 22 is 20 μm.

As shown in FIG. 4, the larger the thickness h of the electric field relaxation region 25 (that is, the larger the thickness y of the gradient distributed low concentration p-type layer region 22), the greater the effect of relaxing the electric field concentration at the pn interface 26 exposed on the end surface, and the breakdown voltage increases. FIG. 4 does not show what happens when the thickness h of the electric field relaxation region 25 exceeds 0.3 μm. However, it is estimated that the breakdown voltage is changed as follows. When the thickness h of the electric field relaxation region 25 exceeds 0.3 μm, the effect of improving the breakdown voltage is gradually saturated, and the larger the thickness h, the lower the breakdown voltage. It is because when the electric field relaxation region 25 is too thick, the reverse voltage for completely depleting the electric field relaxation region 25 is increased, and the effect of relaxing electric field concentration is reduced.

By the semiconductor device according to Embodiment 1, the electric field relaxation region 25 is formed in the terminal region 2, in which the p-type layer 12 is thinned by the recess groove 24, and the gradient distributed low concentration p-type layer region 22 having a carrier concentration lower than that of the p-type layer 12 is formed on the electric field relaxation region 25. Therefore, the electric field concentration at the pn interface 26 exposed on the end surface is relaxed and the breakdown voltage is remarkably improved.

Embodiment 2

Figure 5:
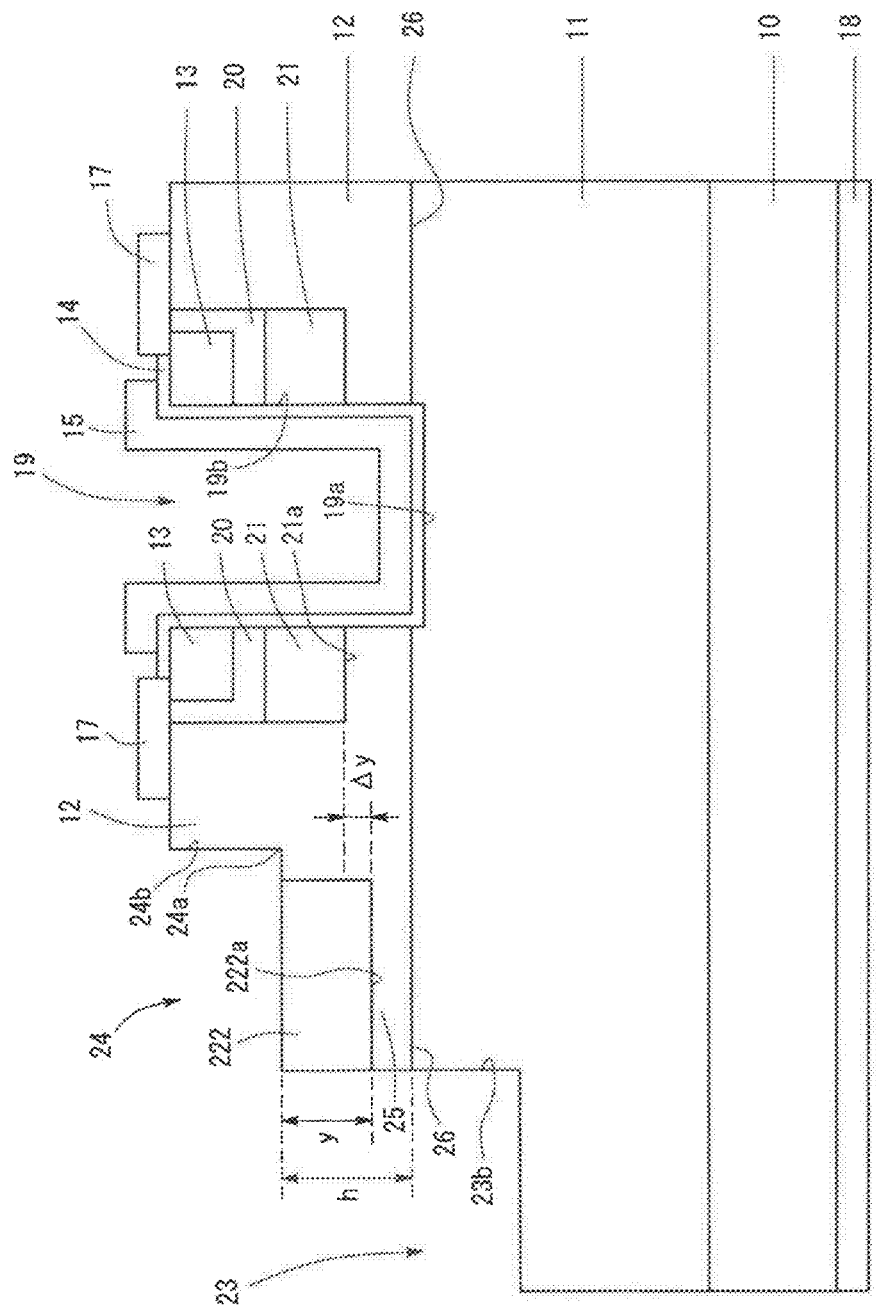
FIG. 5 is a sketch showing the structure of a semiconductor device according to Embodiment 2.

FIG. 5 is a sketch showing the structure of a semiconductor device according to Embodiment 2. The semiconductor device according to Embodiment 2 has the same structure as the semiconductor device according to Embodiment 1 except for that the gradient distributed low concentration p-type layer region 22 is replaced with the gradient distributed low concentration p-type layer region 222.

As shown in FIG. 5, the bottom surface 222a where the gradient distributed low concentration p-type layer region 222 is in contact with the p-type layer 12 is closer to the first n-type layer 11 than the bottom surface 21a where the gradient distributed low concentration p-type layer region 21 is in contact with the p-type layer 12 is to the first n-type layer 11. That is, a height difference Δy is provided between the bottom surface 222a of the gradient distributed low concentration p-type layer region 222 and the bottom surface 21a of the gradient distributed low concentration p-type region 21 just below the second n-type layer 13. The structure of the gradient distributed low concentration p-type layer region 222 is the same as the structure of the gradient distributed low concentration p-type layer region 22 according to Embodiment 1 except for that the position of the bottom surface 222a is different.

Figure 8:
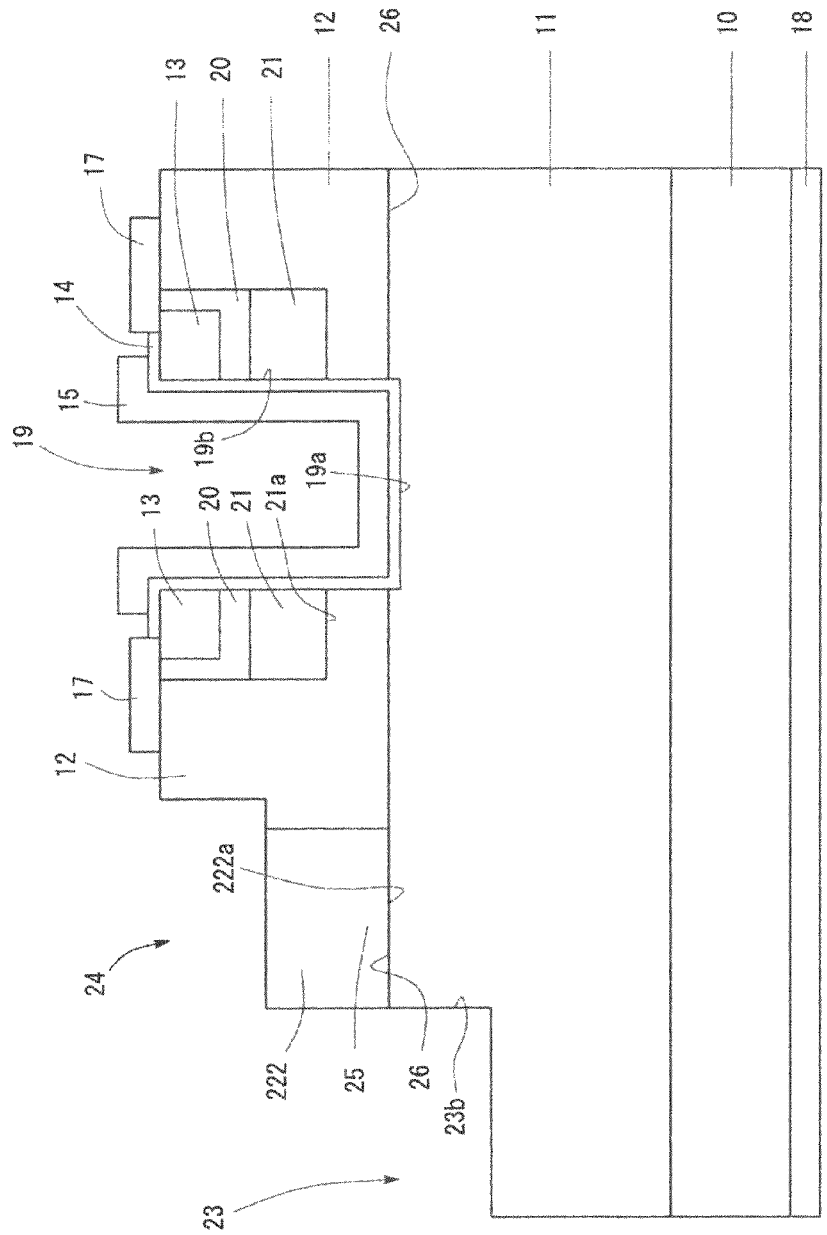
FIG. 8 is a sketch showing the structure of the semiconductor device according to a variation of Embodiment.

Thus, the height difference Δy is provided by lowering the position of the bottom surface 222a of the gradient distributed low concentration p-type layer region 222 lower than the bottom surface 21a of the gradient distributed low concentration p-type layer region 21 just below the second n-type layer 13, thereby further improving the breakdown voltage in the semiconductor device according to Embodiment 2 than in the semiconductor device according to Embodiment 1. The structure may be such that the bottom surface 21a of the gradient distributed low concentration p-type layer region 21 does not reach the pn interface 26, and the bottom surface 222a of the gradient distributed low concentration p-type layer region 222 reaches the pn interface 26 (refer to FIG. 8). In this case, the electric field relaxation region 25 can be more quickly completely completed, thereby further improving the breakdown voltage.

Embodiment 3

Figure 6:
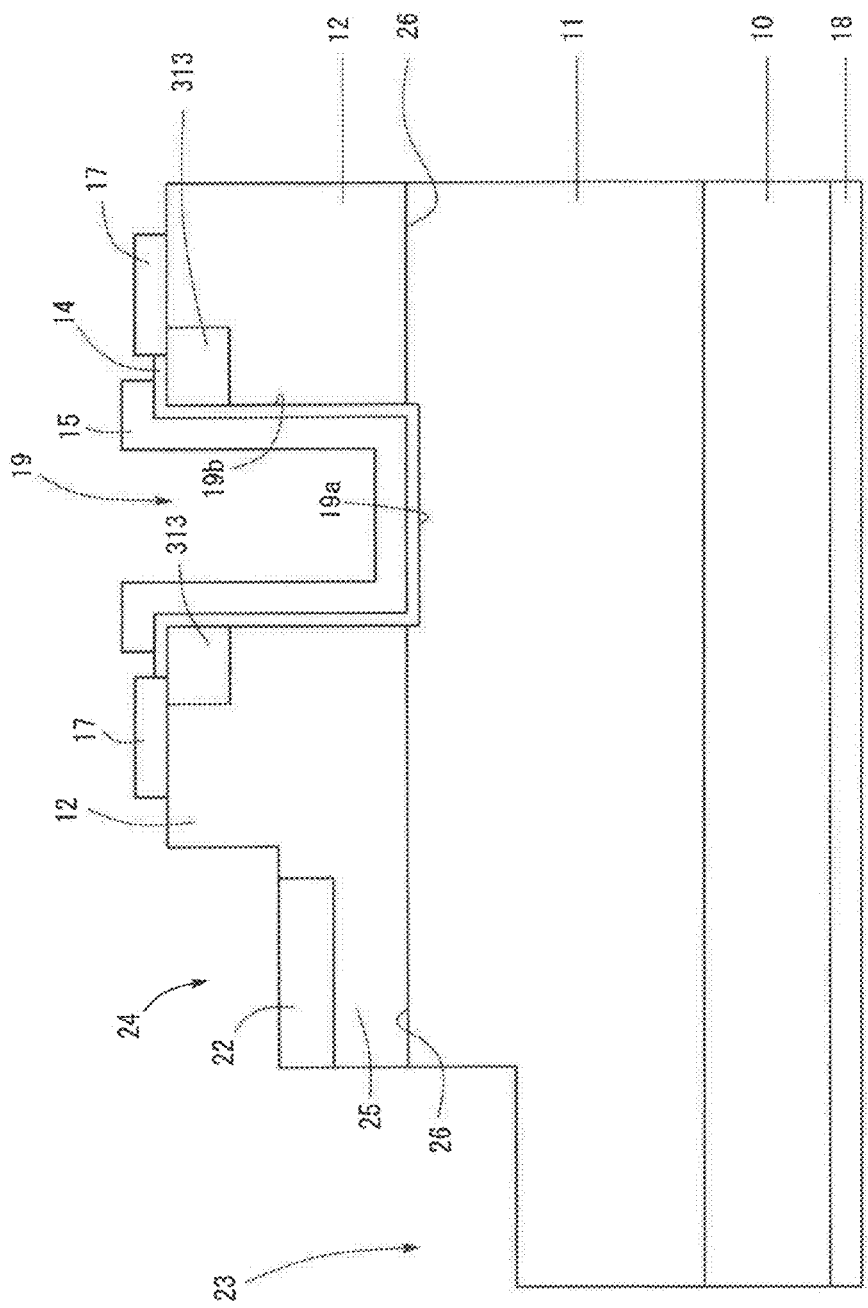
FIG. 6 is a sketch showing the structure of the semiconductor device according to Embodiment 3.

FIG. 6 is a sketch showing the structure of the semiconductor device according to Embodiment 3. The semiconductor device according to Embodiment 3 has the structure in which the second n-type layer 13 is replaced with the second n-type layer 313, and the low concentration p-type layer region 20 and the gradient distributed low concentration p-type layer region 21 are not formed in the semiconductor device according to Embodiment 1. Other structure is the same as the structure of the semiconductor device according to Embodiment 1.

The second n-type layer 313 is a layer made of Si-doped n-GaN formed by crystal growth through MOCVD, and obtains an n-type conductivity by supplying a dopant gas in the crystal growth. Since n-GaN is not formed by ion implantation unlike the second n-type layer 13, a low concentration p-type layer region 20 or a gradient distributed low concentration p-type layer region 21 is not formed just below the second n-type layer 313. In other words, only the p-type layer 12 exists between the second n-type layer 313 and the first layer 11. Therefore, the breakdown voltage is further improved than in the semiconductor device according to Embodiment 1.

Variation

In Embodiments 1 to 3, the gradient distributed low concentration p-type layer region 22 has a carrier concentration distribution inclined in the thickness direction because it is formed by ion implantation. However, it may be a constant low concentration p-type layer region, for example, a layer crystal grown through MOCVD. That is, as long as the maximum value of the carrier concentration is equal to or lower than the carrier concentration of the p-type layer 12, and the average carrier concentration of the entire gradient distributed low concentration p-type layer region 22 is smaller than the carrier concentration of the p-type layer 12, the carrier concentration of the region may be constant or not, and any formation method may be used. However, the gradient distributed low concentration p-type layer region 22 shown in Embodiments 1 to 3 can be easily formed by ion implantation. Particularly in Embodiments 1 and 2, the gradient distributed low concentration p-type layer region 22 can be formed by ion implantation at the same time when the second n-type layer 13 is formed, which offers advantages in simplifying the production process.

The terminal structure of the present invention may be used in combination with the well known terminal structure such as guard ring structure and field plate structure.

The present invention is particularly effective for a semiconductor device having a high breakdown voltage of 1,200 V or more. In the field plate structure, the insulating film needs to be thick to obtain a high breakdown voltage, which makes it difficult to design the device. However, in the present invention, the insulating film does not need to be thick. Therefore, the present invention is more particularly effective for a semiconductor device having a breakdown voltage of 1,500 V or more.

The semiconductor device according to Embodiments 1 to 3 is a MOSFET. However, the present invention is not limited to this. As long as the structure is such that a pn interface is exposed at an end surface of the device by depositing an n-type layer and a p-type layer, the present invention may be applied to any semiconductor device such as IGBT, HFET, and pn diode. The present invention is also effective when the semiconductor device according to Embodiments 1 to 3 has a structure in which the conductivity type is reversed.

The semiconductor device according to Embodiments 1 to 3 uses Group III nitride semiconductor as a semiconductor layer. However, the present invention is not limited to this, and may be applied to a semiconductor device using any semiconductor material such as SiC, Si, SiGe, and Group III to Group V semiconductor. The present invention is appropriate when a high breakdown voltage Group III nitride semiconductor or SiC is used, and more particularly when Group III nitride semiconductor is used.

The semiconductor device of the present invention may be employed as a power device.

What is claimed is:

1. A semiconductor device comprising:
a device region positioned in a center of a device and serving as an operating region of the device;
a terminal region formed in a periphery of the device region and surrounding the device region;
a first layer of a first conduction type semiconductor formed in the device region and the terminal region; and
a second layer of a second conduction type semiconductor formed on the first layer in the device region and the terminal region;
the device region comprising:
a device part of the first layer;
a device part of the second layer;
a trench reaching from a top surface of the device region to the first layer;
a gate insulating film formed on a side surface and a bottom surface of the trench;
a gate electrode formed on the gate insulating film; and
a pn junction between the first layer and the second layer;
the terminal region comprising:
a terminal part of the first layer;
a terminal part of the second layer;
a mesa groove removing an entire thickness of the second layer and a part of the first layer in the terminal region and having a flat bottom surface, and surrounding the device region, wherein an edge of the pn junction is exposed on a side surface of the mesa groove and an entire area of the flat bottom surface is the first layer and a semiconductor layer does not exist in the mesa groove;
a recess groove removing a part of the second layer of the terminal region from a top surface of the terminal region between the device region and the mesa groove so as to surround the device region, and having a flat bottom surface;
an electric field relaxation region under the recess groove, a thickness of the electric field relaxation region being thinner than a thickness of the second layer of the device region;
a third layer of a second conduction type semiconductor formed in the electric field relaxation region and having a carrier concentration lower than a carrier concentration of the second layer in the device region, and
wherein the mesa groove and the recess groove are continued in a two-step shape, and the side surface on the device region side of the mesa groove is flush with the side surface on the mesa groove side of the third layer, and
the side surface on the recess groove side of the third layer is outside the side surface on the device region side of the recess groove.

2. The semiconductor device according to claim 1, wherein the third layer has a carrier concentration distribution in which the carrier concentration is gradually increased in a thickness direction from a top surface of the electric field relaxation region toward the first layer of the terminal region.

3. The semiconductor device according to claim 2, further comprising a fourth layer of a first conduction type semiconductor formed in the second layer of the device region, and a fifth layer of a second conduction type semiconductor being formed in the second layer on the first layer side of the fourth layer and having a carrier concentration distribution in which the carrier concentration is gradually increased from the fourth layer toward the first layer, wherein side surfaces of the fourth layer and the fifth layer are contacted with a side surface of the gate insulating film.

4. The semiconductor device according to claim 3, wherein a bottom surface of the third layer is closer to the first layer than a bottom surface of the fifth layer is to the first layer.

5. The semiconductor device according to claim 1, further comprising a fourth layer of a first conduction type semiconductor formed in the second layer of the device region, wherein the fourth layer is contacted with a side surface of the gate insulating film and only the second layer exists between the fourth layer and the first layer.

6. The semiconductor device according to claim 5, wherein a bottom surface of the third layer reaches the pn junction.

7. The semiconductor device according to claim 3, wherein a bottom surface of the third layer is flush with a bottom surface of the fifth layer, and the second layer exists between the bottom surfaces of the third layer and the fifth layer and the pn junction.

8. The semiconductor device according to claim 3, wherein the semiconductor device is a field effect transistor in which the first layer is a drift region, the second layer is a body region, and the fourth layer is a source region.

9. The semiconductor device according to claim 1, wherein the width of the third layer is 5 μm or more.

10. The semiconductor device according to claim 1, wherein the semiconductor device comprises Group III nitride semiconductor.

* * * * *